US011742803B2

(12) United States Patent
Fiocchi et al.

(10) Patent No.: US 11,742,803 B2
(45) Date of Patent: Aug. 29, 2023

(54) AMPLIFIER CIRCUIT

(71) Applicant: ams AG, Premstätten (AT)

(72) Inventors: Carlo Fiocchi, Premstätten (AT);
Andreas Fitzi, Premstätten (AT);
Andras Mozsary, Premstätten (AT)

(73) Assignee: AMS AG, Premstätten (AT)

( * ) Notice: Subject to any disclaimer, the term of this patent is extended or adjusted under 35 U.S.C. 154(b) by 121 days.

(21) Appl. No.: 17/310,333

(22) PCT Filed: Jan. 21, 2020

(86) PCT No.: PCT/EP2020/051390
§ 371 (c)(1),
(2) Date: Jul. 28, 2021

(87) PCT Pub. No.: WO2020/156884
PCT Pub. Date: Aug. 6, 2020

(65) Prior Publication Data
US 2022/0094307 A1 Mar. 24, 2022

(30) Foreign Application Priority Data
Jan. 31, 2019 (EP) .................................... 19154725

(51) Int. Cl.
*H03F 1/32* (2006.01)
*H03F 3/45* (2006.01)
(52) U.S. Cl.
CPC ....... *H03F 1/3211* (2013.01); *H03F 3/45269* (2013.01); *H03F 2200/294* (2013.01)

(58) Field of Classification Search
CPC ............... H03F 1/3211; H03F 3/45269; H03F 2200/294; H03F 2200/261; H03F 2203/45134; H03F 2203/45138; H03F 3/45475; H03F 1/0272; H03F 1/26; H03F 3/3022; H03F 3/45183; H03F 3/45237; H03F 3/45242; H03F 3/45672
USPC .................................................. 330/252–261
See application file for complete search history.

(56) References Cited

U.S. PATENT DOCUMENTS 8,552,803 B2 * 10/2013 Sun ........................ H03F 3/3022
330/290
2009/0153248 A1  6/2009 Sun et al.
2013/0106513 A1  5/2013 Cyrusian et al.
2015/0054584 A1  2/2015 Chang

FOREIGN PATENT DOCUMENTS

WO    2005120339 A1   12/2005
WO    2015078611 A1    6/2015

OTHER PUBLICATIONS

Communication Pursuant to Article 93(3) EPC dated Dec. 9, 2021, EP Application No. 19154725.6, pp. 1-7.

(Continued)

*Primary Examiner* — Hieu P Nguyen
(74) *Attorney, Agent, or Firm* — MH2 TECHNOLOGY LAW GROUP LLP

(57) ABSTRACT

An amplifier circuit includes a circuit path of serially connected complementary type transistors. First and second feedback loops include a loop amplifier, the transistors of the circuit path and a corresponding resistor.

15 Claims, 7 Drawing Sheets

(56) References Cited

OTHER PUBLICATIONS

Johnson, B. et al., "An Orthogonal Current-Reuse Amplifier for Multi-Channel Sensing", IEEE Journal of Solidstate Circuits, vol. 48, No. 6, Jun. 2013, pp. 1487-1496.
International Search Report and Written Opinion in corresponding International Application No. PCT/EP2020/051390 dated Mar. 27, 2021, 11 pages.

* cited by examiner

AMPLIFIER CIRCUIT

CROSS-REFERENCE TO RELATED APPLICATIONS

The present application is the national stage entry of International Patent Application No. PCT/EP2020/051390, filed on Jan. 21, 2020, and published as WO 2020/156884 A1 on Aug. 6, 2020, which claims the benefit of priority of European Patent Application No. 19154725.6, filed on Jan. 31, 2019, all of which are incorporated by reference herein in their entirety.

TECHNICAL FIELD

The present disclosure relates to an amplifier circuit. Specifically, the present disclosure relates to a low noise amplifier circuit including input transistor, resistor network and feedback loop. The amplifier circuit may be used to amplify signals generated by a sensor.

BACKGROUND

Amplifier circuits are widely used in electronic devices to amplify the amplitude of an input signal so that the amplified output signal can be further processed in analog and digital signal processing circuitry. The to be amplified signal may be very small such as a signal obtained from a sensor so that the amplifier should have a noise level that is as low as possible. Conventional low noise amplifiers (LNAs) include a feedback loop to ensure high accuracy, high linearity and low distortion levels. For a sensor generated input signal, the input impedance of the amplifier should be relatively high or infinite. Although a low noise level may require additional circuit components, the power consumption of the amplifier should be low.

It is an object of the present disclosure to provide an amplifier circuit having high accuracy, high linearity and low noise levels.

It is another object of the present disclosure to provide a sensor arrangement including such an amplifier.

SUMMARY

One or more of the above-mentioned objects are achieved by an amplifier circuit comprising the features of present claim 1.

An amplifier circuit according to the present disclosure comprises a circuit path that includes first and second serially coupled transistors of complementary conduction type such as a series connection of the drain source paths of a PMOS and a NMOS transistor. The to be amplified signal is supplied to the control terminals of the first and second transistors. Feedback loops include the first and second transistors and a first and a second resistor connected to output terminals of the amplifier circuit. The feedback loops include a loop amplifier having complementary output terminals of which the input is connected to a node between the first and second transistors of the circuit path. Third and fourth resistors are connected to the first and second resistors of the feedback loops to form respective defined ohmic voltage dividers that provide an amplification factor given by the relation of the resistors. The third and fourth resistors may be shared with a complementary operating circuit that enables differential input and output signals. For single-ended operation, the third and fourth resistors may also be coupled to reference potentials.

The first and second complementary transistors include in first and second feedback loops in connection with the resistor network allows a LNA amplifier with low power consumption and 3 dB noise improvement.

First and second differential pairs of transistors may be connected to the first and second transistors of the circuit path to obtain a stacked architecture. The differential pair transistors are operated with a complementary input signals so that the first and second transistors and one of the differential pair transistors receive the same input signal. The stacked architecture increases the signal-to-noise ratio up to 6 dB.

The differential pair transistors of the stacked variant should exhibit a lower threshold voltage compared to the first and second transistors of the circuit path. Low voltage threshold (LVT) transistors can be achieved by various measures known to a skilled person such as increasing the gate oxide thickness, additional doping or implants at the channel region or additional voltages at the bulk region. Other measures apparent to a skilled circuit designer are also useful. Conventional and LVT transistors in the stacked arrangement achieve proper working points of the transistors to ensure linearity and accuracy of signal amplification.

A current conveyer circuit may be connected from the node between the first and second transistors of the current path to the resistor network or to the outer terminals of the current path such as the source terminals of the first and second transistors. The current conveyer circuit provides a correction current to the current path transistors so that linearity of the amplifier is increased and thermal dependencies are reduced. The LNA circuit including the current conveyer circuit provides an increased signal-to-noise level at high linearity over a wide temperature range. The current conveyer circuit includes circuitry that senses the current through the circuit path and provides a replica current to the outer terminals of the circuit path which is connected to the resistor network. Specifically, the current conveyer circuit may comprise a pair of source connected push pull transistors to sense the current through the circuit path wherein a drain terminal of the push pull transistors provides the replica current output. Bias currents may be provided to the source connected transistors through corresponding current mirror circuits. Additional replica current outputs can be provided through current mirrors.

According to an embodiment of the current conveyer circuit, a feedback loop through a comparator amplifier may control the current through a reference current path that generates reference potentials that are supplied to the source connected push pull transistors. The comparator amplifier receives also a common mode voltage as a reference. The common mode voltage may be substantially in the middle of the signal voltage swing. The feedback loop including comparator amplifier decreases the input impedance. The source connected transistors have the function of a push pull current sensor.

According to one embodiment, the current conveyer circuit may be a non-inverting circuit that senses the current in the current path and provides the replica current to that current path. According to another embodiment, the current conveyer circuit may be an inverting circuit that senses the current in the current path at one side of a complementary amplifier topology and provides the replica current to the other, complementary circuit side. In the non-inverting current conveyer circuit, sensing and replica output current is performed within the same push pull stage. In the inverting current conveyer circuit, sensing and replica output current is performed within the different current paths connected through current mirrors.

The loop amplifier can be realized with different circuits. According to one embodiment, the loop amplifier comprises a differential amplifier of which the input is connected to the node between the first and second transistors of the circuit path. The differential loop amplifier generates an output signal to control corresponding transistors that are connected to the resistor network, specifically to control the current through the first and second resistors. A buffer transistor transfers the potential from the node between the first and second transistors of the circuit path to the input of the differential loop amplifier.

According to another embodiment, the loop amplifier may comprise a class AB stage including first and second transistors that are connected to the resistor network. Specifically, the class AB transistors are connected in series with the first and second resistors. A buffer transistor is connected to the node between the first and second transistors of the circuit path and to one of the transistors of the class AB stage. Complementary transistors are provided for biasing the control terminals of the transistors of the class AB stage.

As an alternative to a current conveyer circuit for linearity correction, a fifth and a sixth resistor may be provided connected between the differential pair transistors. An additional transistor may be provided to connect the fifth and sixth resistor with the first and second resistors, respectively, so that the input stage of the amplifier has a symmetrical shape. A correction current is injected at the terminals of the fifth and sixth resistors. The correction current is generated by additional class AB stages controlled by the node between the first and second transistors of the current path. This embodiment may be preferably operated with a class AB stage loop amplifier that provides the output transistors connected serially with the first and second resistors.

According to an embodiment, the fifth and sixth resistors may have twice the size of the other resistors such as the first and second resistor. The class AB stage output transistors connected to the resistor network may have transistors of twice the size than the transistors of the additional class AB stages that are connected to the terminals of the fifth and sixth resistors.

A low noise amplifier according to the above-described principles may be used to amplify signals of low amplitude such as signals from a sensor. The sensor signal may be a differential signal that depends on an ambient condition determined by the sensor. The differential sensor signal may be very weak and close to noise level so that the LNA amplifies the signal and increases the signal-to-noise ratio at high linearity and low power consumption.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION OF EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
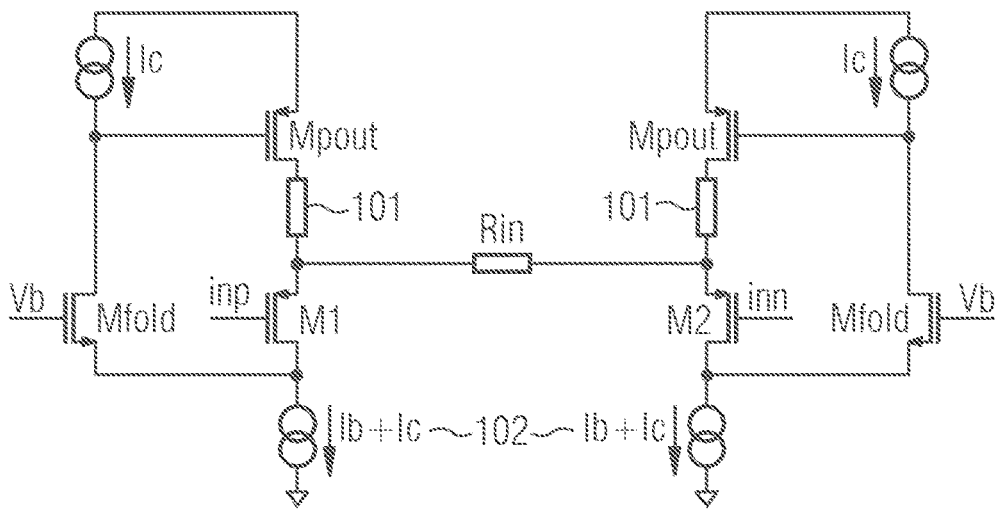
FIG. 1 shows a conventional low noise amplifier.

FIG. 1 shows a conventional instrumentation amplifier. The amplifier includes a PMOS input transistor M1 receiving an input signal inp. Transistor M1 is supplied with a constant current by PMOS transistor Mpout through resistor 101 connected in series with transistor M1. A transistor Rin is connected to the source of transistor M1. The current through M1 is drained through a constant current source 102 connected to the drain of transistor M1 draining current Ib+Ic. A feedback loop comprises NMOS folding transistor Mfold controlled by a constant potential Vb and constant current source Ic connected to the high side. The loop of folding transistor Mfold and output transistor Mpout provides a constant current through input transistor M1. The current source Ic and current 102 supplying current Ib+Ic control the working points of the transistors. The source terminal of transistor M1 directly follows the input signal inp. The voltage divider between resistor 101 and resistor Rin allows an amplification factor so that the signal at the drain of transistor Mpout is an amplified signal of the input signal inp. The circuit of FIG. 1 comprises left-hand and right-hand portions that have identical structures, however, are controlled by the complementary input signals inp, inn, wherein both complementary sections are coupled across resistor Rin. Alternatively, also a single-ended circuit is conceivable wherein one end of resistor Rin may be connected to a reference potential or ground.

The differential input signals inp, inn are transferred unaltered to the sources of the input transistors M1, M2. The signal current generated across resistor Rin is supplied by the output stages Mpout of the feedback loops. A differential output signal is supplied at the drain terminals of the output transistors Mpout that is connected to the resistors 101. The two oppositely disposed level shift transistors M1, M2 receive the differential input signal inp, inn and drive the resistor Rin between their sources. Both level shift transistors M1, M2 are included in an associated feedback loop to transfer the input signals to the resistor terminals with accuracy. The two load resistors 101 collect the generated current and provide the amplified output signal. The current through transistors M1, M2 is substantially constant so that the input signal is transferred unaltered to the terminals of the resistor Rin. The output devices Mpout supply the signal current across resistor Rin so that the current flow across the series load resistors 101 provides an amplification of the input signal inp, inn.

Figure 2:
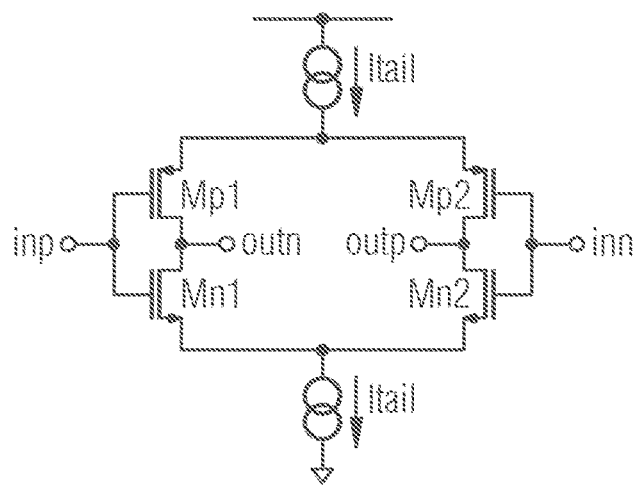
FIG. 2 shows another conventional low noise amplifier.

Turning now to FIG. 2, another conventional low noise amplifier is shown. The circuit in FIG. 2 includes, firstly, differentially operated left and right portions and, secondly, complementary upper and lower portions operated with the same input signal. The circuit includes NMOS input transistor Mn1 and PMOS input transistor Mp1 that are serially connected and controlled by the input signal inp to provide an output signal outn at the output terminal connected to the node between Mp1 and Mn1. The circuit path of transistors Mn1, Mp1 is supplied by identical currents Itail connected between the transistors Mp1 and Mn1 and supply and ground potentials, respectively. The complementary upper and lower portions of the amplifier circuit of FIG. 2 operate in parallel and are biased by a current generator Itail. The overall transconductance is doubled while the voltage noise increases only with factor 1.4 because of the quadratic sum. This leads to a 3 dB reduction of input referred noise. The output currents at the output signals outn, outp are collected by mirrors or current buffers to drive an output stage of the amplifier (not shown in FIG. 2).

Figure 3:
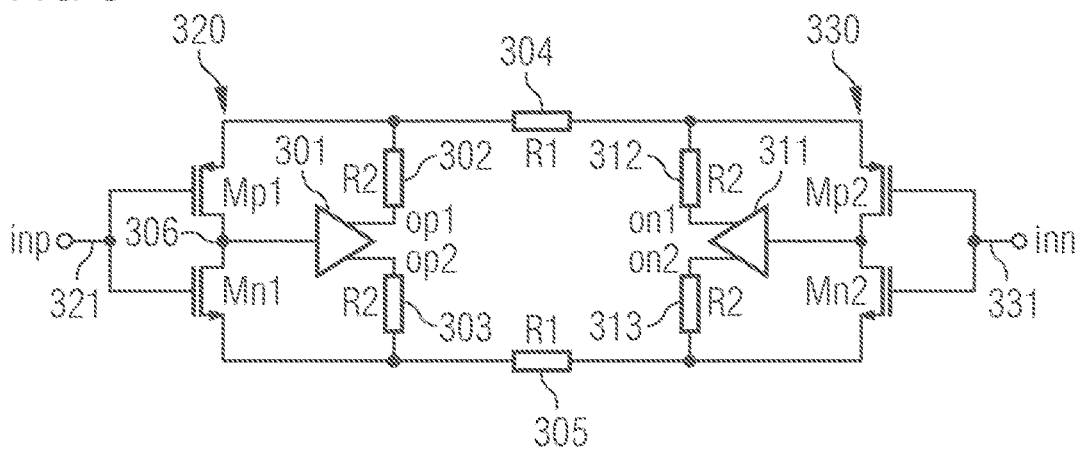
FIG. 3 shows a low noise amplifier according to the principles of the present disclosure.

FIG. 3 shows a principle diagram of a low noise amplifier (LNA) circuit according to the principles of the present disclosure. The LNA circuit comprises a left-hand portion and a right-hand portion allowing differential processing of the complementary input signals inp, inn constituting a differential type input signal. Left-hand and right-hand portions have identical structures operated by complementary signals. The upper and lower portions have complementary structures and are operated by the same input signals.

A circuit path 320 includes PMOS input transistor Mp1 and NMOS input transistor Mn1 of which the drain source paths are serially connected forming current path 320. The input terminals of transistors Mp1, Mn1 are connected to input terminal 321 receiving input signal inp. A feedback loop to PMOS transistor Mp1 includes a loop amplifier 301 and a feedback resistor 302 connected from the output op1 to the source of transistor Mp1. Another feedback loop to NMOS transistor Mn1 includes a loop amplifier 301 connected from another output op2 through resistor 303 to the source of transistor Mn1. The loop amplifier 301 has an input that is connected to the node 306 disposed between input transistors Mp1, Mn1. Resistors 304, 305 are connected to the resistors 302, 303 and the sources of transistors Mp1, Mn1, respectively. The resistor network of resistors 302, 304 and 303, 305 each form a divider such as a voltage divider such as an ohmic voltage divider so that the output signals at terminals op1, op2 are amplified with regard to the input signal inp at input terminal 321. The amplification factor depends on or is determined by the ratio between resistors 302, 304 or 303, 305. Resistors 304, 305 are shared between the left-hand and right-hand differentially operated circuit portions. In a single-ended version, resistors 304, 305 may be connected to a reference or ground potential. Resistors 302 and 304 form an ohmic voltage divider, and resistors 304 and 305 form another ohmic voltage divider. The ohmic voltage divider and the other ohmic voltage divider may each include a pair of resistors, wherein the resistor pairs are corresponding or the same. The current generated across resistor 304 is forced to cross resistor 302 by the arrangement made up by transistor MP1 and amplifier 301 so that resistors 302, 304 act as a voltage divider as the resistors are crossed by the same current. Resistors 303, 305 exhibit the same function.

The feedback loop of the amplifier of FIG. 3 comprises the input transistors Mp1, Mn1. The input to the feedback loop is at the coupled drains of the input transistors. The output of the feedback amplifier has two branches, one for pullup and the other one for pulldown. The input stage requires two resistors 304, 305 of equal resistance Rin. The output signals at output terminals op1, op2 are the currents through the load resistors 302, 303 and are to be summed up with a convenient summing operation. The loop amplifier 301 uses a virtual ground set at a suitable voltage to comply with the dynamic range of the input transistors Mp1, Mn1. The input signal inp is buffered by the level shift transistors Mp1, Mn1 and transferred across the input resistors 304, 305. The output stage of the loop amplifier 301 sinks or sources the generated currents. With the load resistors 302, 303, the output voltage at terminals op1, op2 can be conveniently summed with the correct sign. In case of a differentially operating circuit using left-hand and right-hand portions, the voltages at terminals op1, op2, on1, on2 must be summed conveniently with the correct sign. The circuit shown in FIG. 3 achieves a noise improvement of 3 dB through the complementary arrangement of complementary PMOS and NMOS input transistors Mp1, Mn1. Additional improvements may be useful as explained hereinbelow to address thermal drift of the gain and signal distortion.

Figure 4:
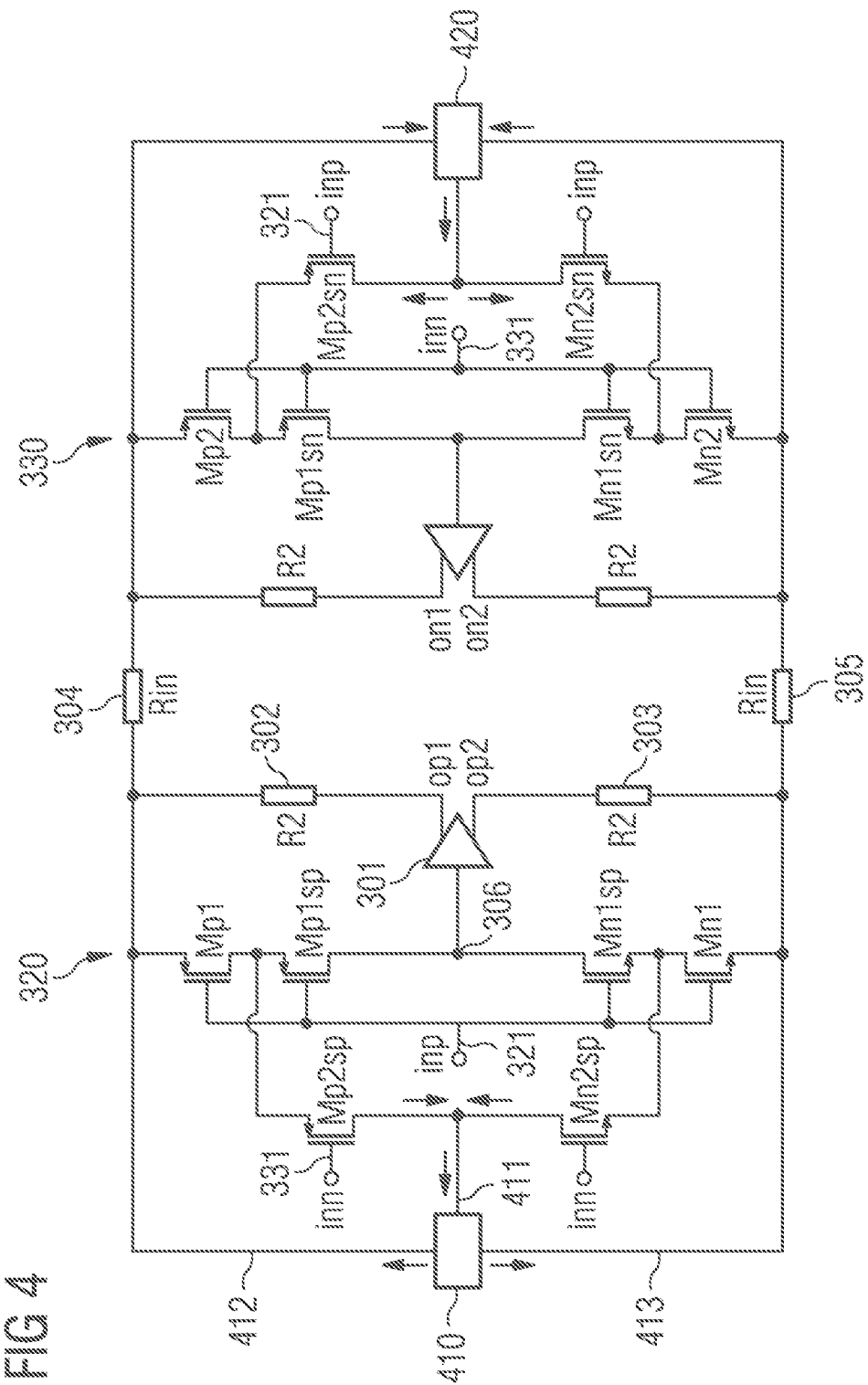
FIG. 4 shows a low noise amplifier according to the principles of the present disclosure including stacked input transistors and current conveyer circuit.

FIG. 4 shows an expanded version of the circuit of FIG. 3. The circuit path 320 shows a stacked architecture including complementary additional differential transistor pairs PMOS transistors Mp2*sp*, Mp1*sp* having source terminals connected with each other and connected to the drain terminal of PMOS transistor Mp1. Further included in circuit path 320 is a differential pair of NMOS transistors Mn2*sp*, Mn1*sp* having source terminals connected with each other and connected to the drain of NMOS transistor Mn1. The control terminals of transistors Mp1, Mn1 and Mp1*sp* and Mn1*sp* are connected to the input terminal 321 receiving input signal inp. The control terminals of the other transistors of the differential transistor pairs Mp2*sp* and Mn2*sp* are connected to input terminal 331 carrying complementary input signal inn. The transistors of the differential transistor pairs are low voltage threshold (LVT) devices that may be obtained by a thicker gate oxide, a special channel doping or a bulk bias voltag or a combination of said measures. The right-hand portion of the circuit has an identical structure, however, the control terminals of the input transistors are supplied with the complementary input signals to allow differential operation of the circuit. The stacked implementation has double transconductance of the input transistors while the noise is quadratically summed which is another 3 dB improvement in noise achievement. The overall performance makes a 6 dB noise improvement while maintaining the same power consumption.

The drain terminals of the differential transistor pairs are connected to each other to reuse the current from one of the differential transistor pairs such as transistors Mp2*sp*, Mp1*sp* in the other one of the differential transistor pairs such as transistors Mn2*sp*, Mn1*sp*, as shown in FIG. 4. Alternatively, it is also possible to disconnect the differential transistor pairs and connect one of the transistors of a differential transistor pair such as transistor Mp2*sp* to ground potential and one of the transistors of the other differential transistor pair such as transistor Mn2*sp* to supply potential (not shown in FIG. 4). The latter transistors are those that are not connected to the loop amplifier. While transistors Mp2*sp*, Mn2*sp* connected to ground and reference potential, respectively, have an increased power consumption, the circuit shown in FIG. 4 with the shared drains of Mp2*sp*, Mn2*sp* has reduced power consumption.

A current conveyer circuit 410 is provided to sense the current at the drain terminals of the transistors of the differential transistor pairs that are not connected to the loop amplifier 301. Specifically, the drain terminals of transistors Mp2*sp*, Mn2*sp* are connected to the input 411 of current conveyer circuit 410. Current conveyer circuit 410 comprises two output terminals 412, 413 that are connected to the sources of the transistors Mp1, Mn1. The outputs 412, 413 of the current conveyer circuit 410 are at the same way connected to the node between the resistors 302, 304 and 303, 305 which are, in turn, connected to the sources of the transistors Mp1, Mn1. The current conveyer circuit 410 generates a replica from the current sensed at terminal 411 and forwards the replica currents at terminals 412, 413 to the sources of transistors Mp1, Mn1 of circuit path 320. The current conveyer injects a current into the circuit path 320 to enhance linearity and avoid a thermal drift issue. The replica currents generated by current conveyer 410 compensate the effect of the currents through the transistors Mp2*sp*, Mn2*sp* to correct the current contribution by these transistors through the resistors 302, 303.

Figure 5:
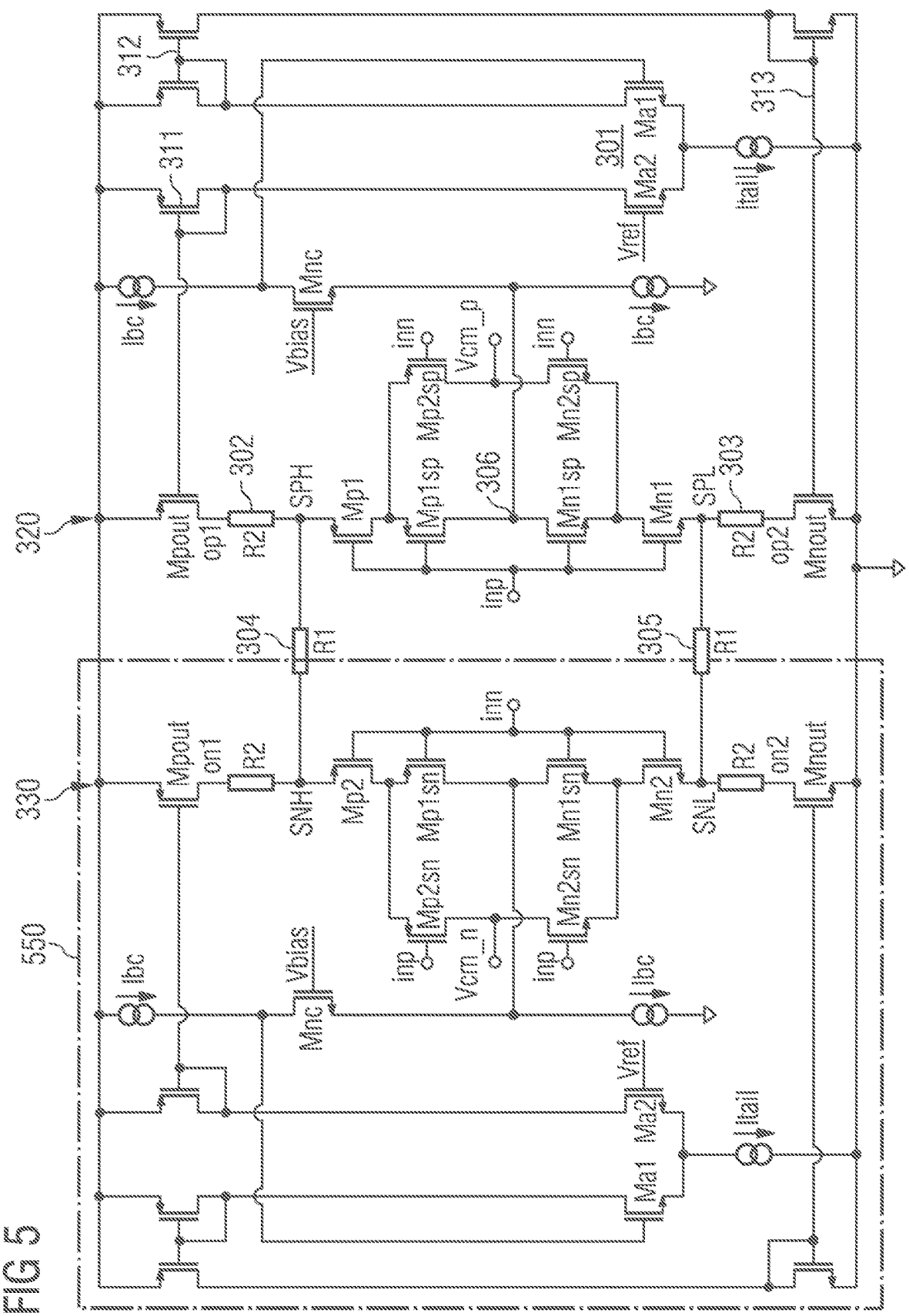
FIG. 5 shows a schematic representation of a portion of a low noise amplifier.
Figure 6:
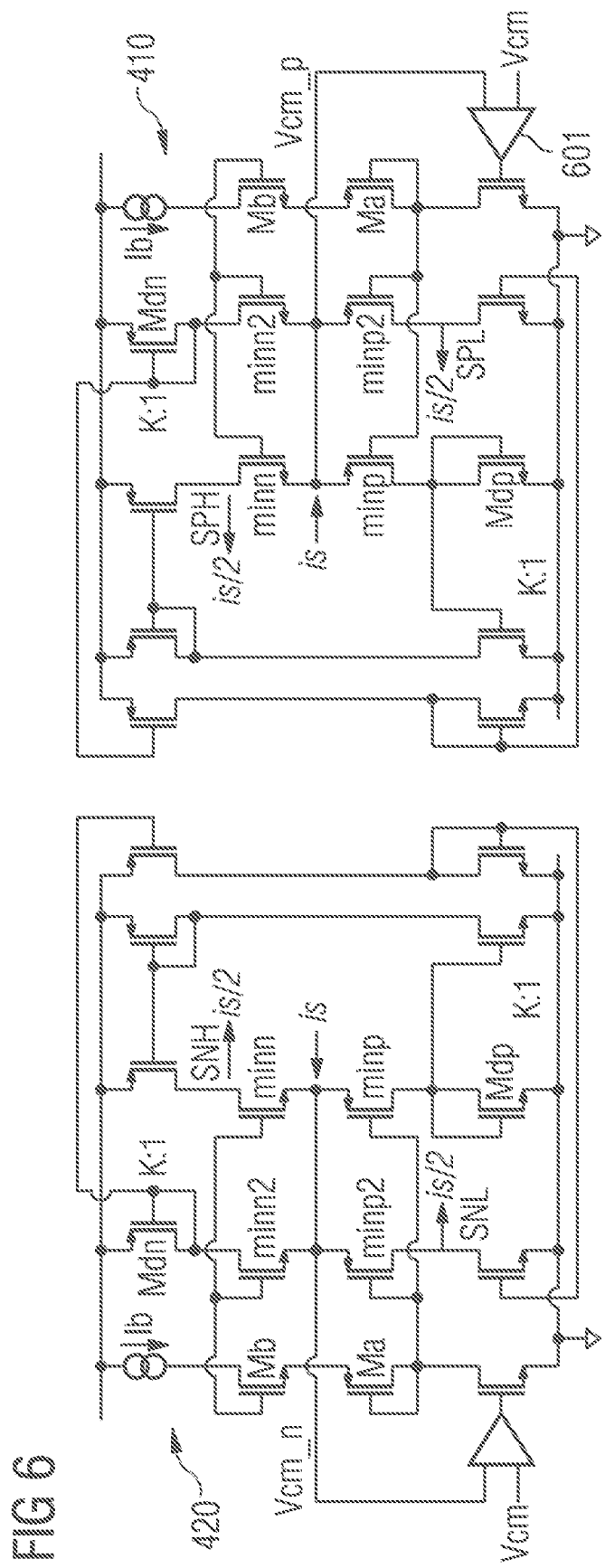
FIG. 6 shows a non-inverting current conveyer circuit to be used in connection with the circuit of FIG. 5.
Figure 7:
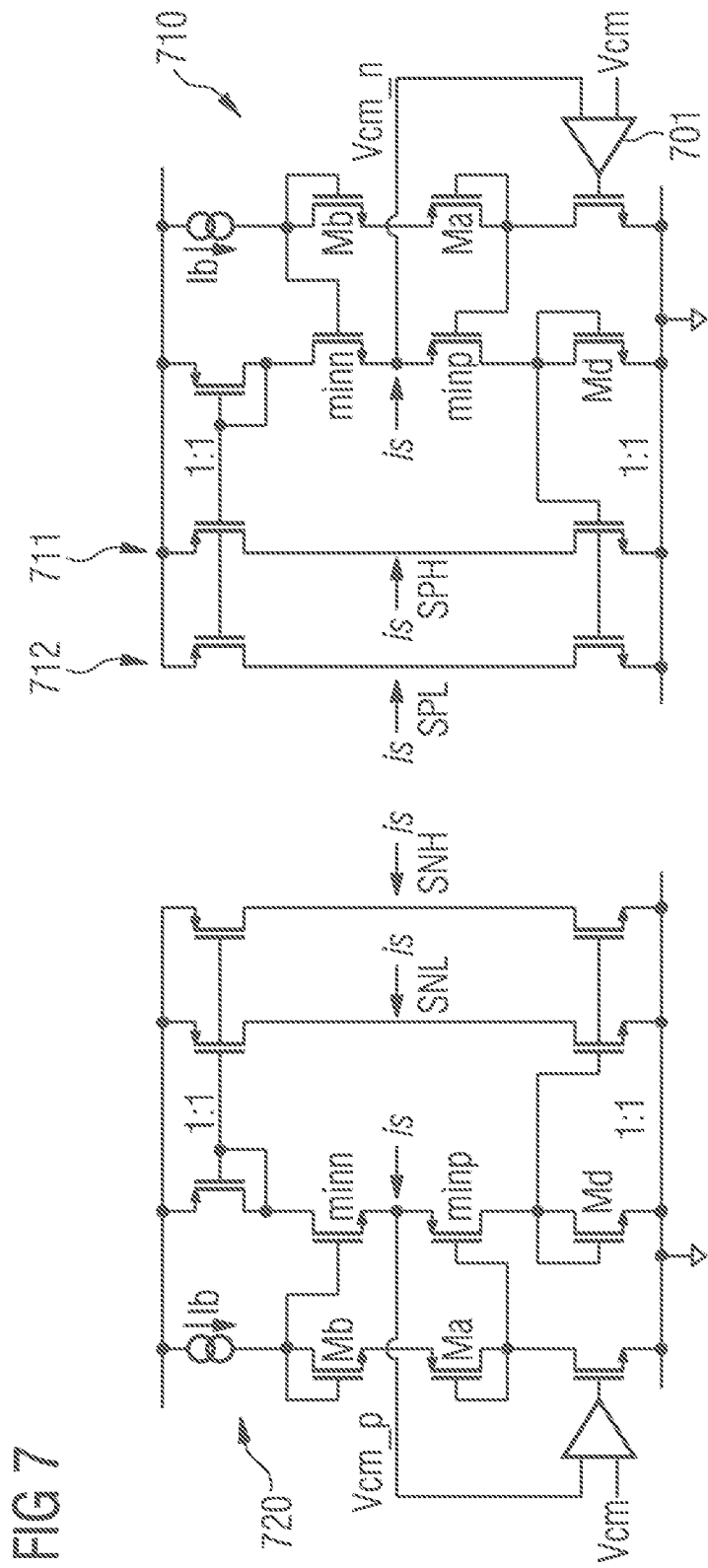
FIG. 7 shows an inverting current conveyer circuit to be used in connection with the circuit of FIG. 5.

FIG. 5 in connection with FIG. 6 or 7 show a detailed schematic diagram of the circuit of FIG. 4. It is to be noted that the left-hand portion of FIG. 4 is shown at the right-hand side of FIG. 5. FIG. 5 includes the stacked transistor arrangement along the circuit path 320. The loop amplifier 301 is represented in FIG. 5 on transistor level. Amplifier 301 includes a differential pair of transistors Ma1, Ma2 supplied by a constant current Itail. The control terminal of transistor Ma1 is controlled by the input 306 of the loop amplifier connected to the coupled drain terminals of transistors Mplsp, Mnlsp of the current path 320. A common gate buffer transistor Mnc provides a signal level shift from node 306 to transistor Ma1. The buffer transistor Mnc is controlled by a bias voltage Vbias, the source of buffer transistor Mnc is connected to node 306 and the drain of buffer transistor Mnc is connected to the control terminal of transistor Ma1 of the differential amplifier 301. The drain source path of buffer transistor Mnc includes a corresponding constant current source Ibc at the high side and the low side. The buffer transistor Mnc prevents a large swing at the loop amplifier input from appearing also on node 306 which might affect linearity so that transistor Mnc improves linearity of the amplifier. Transistor Mnc is not mandatory and may be omitted or replaced by other elements. The output transistor Mpout connected to the load resistor 302 is controlled through current mirror 311 of amplifier 301. In a corresponding way, the complementary output transistor Mnout connected to resistor 303 is controlled by amplifier 301 through current mirrors 312, 313. The left-hand portion 550 of the circuit has the same structure, however, operated with the complementary input signals to achieve a fully differential operating scheme.

The LNA has input transistors Mp1, Mn1 embedded in a feedback loop. The input signal inp is transferred without appreciable distortion onto resistors 304, 305. The signal current generated in this way comes from the feedback loop output stage Mpout, Mnout to cross the resistors 302, 303, wherein resistors 302, 303 are matched to resistors 304, 305, resp. In this way, an amplified version of the input signal is available at the terminals op1, op2 of the resistors 302, 303. With resistors 304, 305 having a resistance value of R1 and resistors 302, 303 having a resistance value of R2, at the terminals of resistors 302, 303, an amplified version of the input signal inp is available, which is 1+R2/R1 times bigger than the input signal. The resistance values R1 and R2 may be different. In another variant, the resistance values R1 and R2 may be the same or substantially the same. Noise is substantially dictated by the input transistors Mp1, Mn2 and the resistors 304, 305. The output voltage of the fully differential implementation is the sum of the voltage drops across the four load resistors 302, 303 and the corresponding resistors in circuit portion 550.

In FIGS. 6 and 7, two alternative versions of current conveyer circuits are shown that form part of the circuit of FIG. 5. For reasons of simplicity, these circuits are moved to separate figures. FIG. 6 relates to a non-inverting version and FIG. 7 relates to an inverting version of the current conveyer circuits that may be used alternatively.

The non-inverting current conveyer circuit 410 of FIG. 6 comprises input transistors minn, minp. Transistors minn, minp are connected in push pull fashion having current source transistors at the high and low sides. The inputs of circuit 410 are the shared drains of Mp2*sp*, Mn2*sp* carrying signal Vcm_p. One output of current conveyer 410 is the drain of push pull transistor minn which supplies a replica current to the source of transistor Mp1 of the current path 320 and/or the node between resistors 302, 304. In operation, circuit 410 senses the current is at the shared drain of transistors Mp2*sp*, Mn2*sp* and outputs a replica current is/2 to be forwarded to the drain of transistor Mp1 labelled as node SPH. Complementary-wise, another replica current is/2 is to be supplied to the source of transistor Mn1 at node SPL. This current is generated in a corresponding additional current path in current conveyer 410 including push pull transistors minn2, minp2. Additional current paths including several current mirrors are used in circuit 410 to provide proper biasing of the currents. Current conveyer circuit 420 is connected to the left-hand circuit portion 550 and senses signal Vcm_n at the shared drains between transistors Mp2*sn*, Mn2*sp* and supplies a respective replica current to the sources at transistors Mp2, Mn2 at nodes SNH, SN1. The currents across the LVT transistors which are not embedded in the feedback loop, for example, the currents through transistors Mp2*sp*, Mn2*sp* may be a source of relevant distortion. The current conveyer senses these currents and injects replicas at the sources of the input devices Mp1, Mn1, to prevent them from crossing the load resistors 302, 303 to contribute to the output voltage. This minimizes the overall LNA distortion.

According to an embodiment, the input signal Vcm_p from the shared drains of Mp2*sp*, Mn2*sp* is forwarded to a comparator amplifier 601 also supplied with a common mode voltage Vcm. The output of the comparator amplifier 601 controls a current path with push pull bias transistors Mb, Ma which control the push pull control transistors minn, minp, minn2, minp2. This avoids an excessive voltage swing at the input stage when a large current is injected into the input of the current conveyer which might generate a source of distortion. This is avoided with the minimized input impedances of the comparator amplifier 601. The feedback loop in the current conveyer prevents large swing at the input of the current conveyer from coupling into the input stage thereby avoiding distortion. The common sources of the push pull source connected transistors minn, minn2, minp, minp2 are regulated by opamp 601 at a convenient reference voltage Vcm regardless of the amount of current that the regulator should sink or source.

FIG. 7 shows an alternative current conveyer circuit of the inverting operating type. Circuit 710 includes push pull input transistors minn, minp which are connected to the shared drains of transistors Mp2sn, Mn2sn in the left-hand portion 550 of the circuit of FIG. 5. The output terminals of circuit 710 are provided by push pull stages 711, 712 that form current mirrors with the input current path including transistors minn, minp. The output stage 711 of current conveyer 710 including node SPH is connected to the source of transistor Mp1 of circuit path 320 at the right-hand portion of the circuit of FIG. 5. Correspondingly, the output node SPL of output stage 712 is connected to the source of transistor Mn1 of FIG. 5. The input of current conveyer circuit 720 is supplied with signal Vcm_p at the right-hand portion of the circuit of FIG. 5 and supplies the output signals to nodes SNH, SNL at the left-hand portion 550 of FIG. 5. In a fully differential amplifier solution it is a matter to swap the injection points towards the complementary section.

The current conveyer circuits of FIGS. 6 and 7 suppress the main sources of distortion and thermal drift in FIG. 5 by supplying replica currents. The non-inverting version of FIG. 6 reduces the power consumption as half of the signal current goes directly from the input to the output without crossing any mirror, avoiding load to any supply rail. The output of the non-inverting conveyer of FIG. 6 is connected to the same right or left-hand section where the input belongs. The inverting conveyer circuit of FIG. 7 senses the current from one section and supplies the output current replicas to the complementary section. The inverting version offers more flexibility because the output currents always require a current mirror which also allow a multiplication of the current. The inverted version of FIG. 7 allows also a feedback loop with comparator amplifier 701 to minimize the impedance at its input.

Figure 8:
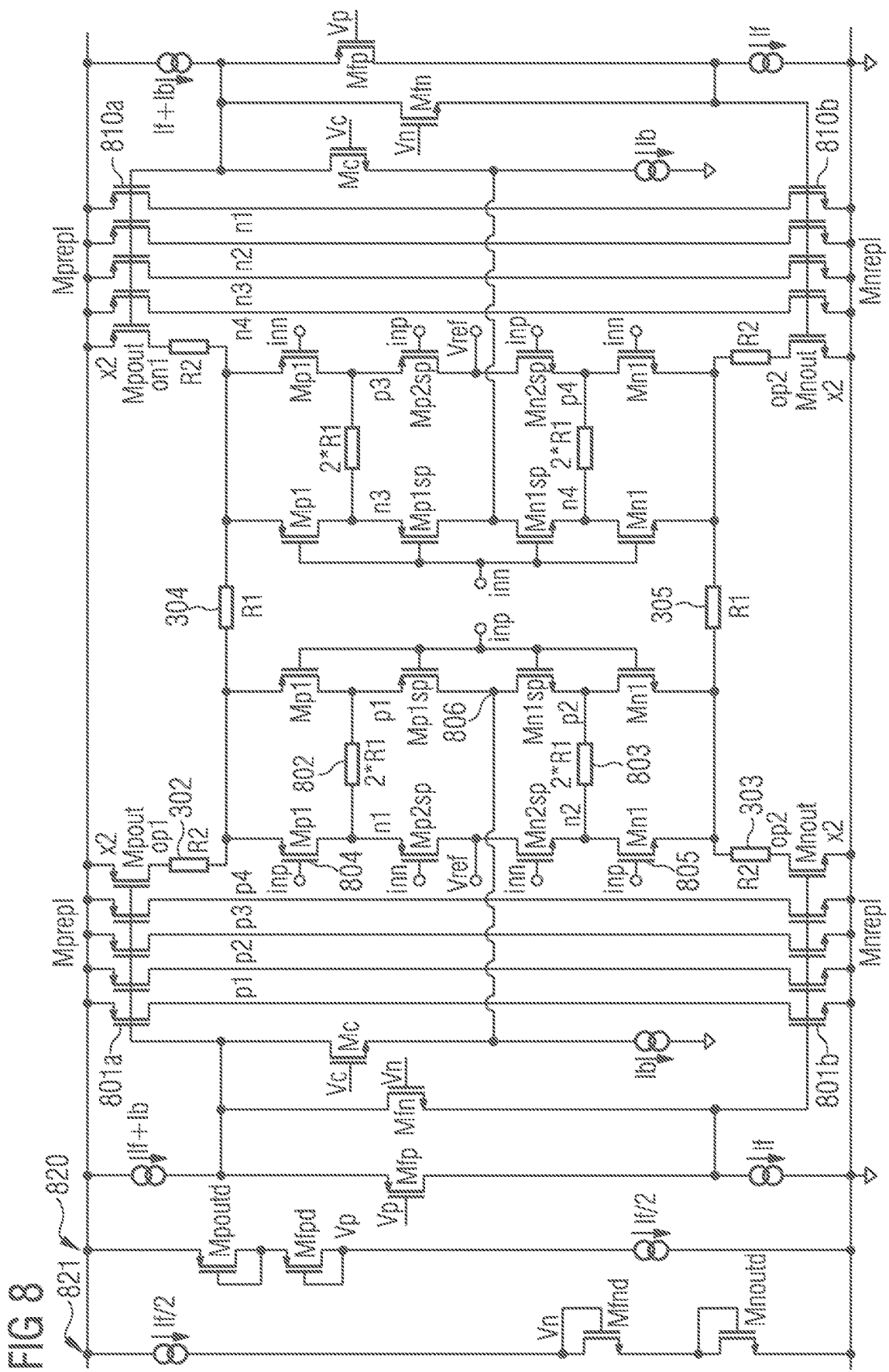
FIG. 8 shows a schematic representation of another low noise amplifier.

Turning now to FIG. 8, another realization of a low noise amplifier is shown which is alternative to the circuits in FIGS. 5 to 7. The circuit of FIG. 8 uses a class AB type loop amplifier instead of a differential type amplifier and uses an alternative to a current conveyer circuit to improve linearity of the amplifier. In more detail, the circuit in FIG. 8 includes an additional resistor 802 that is connected between the sources of the differential pair transistors Mp2sp, Mp1sp. Correspondingly, resistor 803 is connected between the drains of the complementary differential pair transistors Mn2sp, Mn1sp. A PMOS transistor 804 is furthermore connected between the resistors 802 and 302 or between the source of transistor Mp2sp and the resistor 302 connected to the output transistor Mpout at output terminal op1. Transistor 804 is controlled by input signal inp, the same as transistor Mp1 of current path 320. Correspondingly, transistor 805 is connected between resistors 803, 303 or between the source of transistor Mn2sp and the resistor 303 connected to the output transistor Mnout at output terminal op2 in the complementary lower portion of the circuit. Additional resistor 802 and additional transistor 804 as well as additional resistor 803 and additional transistor 805 inject an additional current into transistors Mp2sp and Mn2sp, respectively, which increases the linearity of the amplifier stage.

According to embodiments, the resistance values of the resistors 302 and 304 have a ratio on which the gain depends. The additional resistor 802 has two times the resistance value of resistor 304. Correspondingly, the resistance values of the resistors 303 and 305 have the same ratio, wherein the additional resistor 803 has two times the resistance value of resistor 305. Furthermore, resistors 302 and 303 have the same value and resistors 304 and 305 have the same value.

Concerning the loop amplifier, a class AB type amplifier is used in the circuit of FIG. 8. The class AB type amplifier comprises a class AB stage of output transistors Mpout, Mnout connected to resistors 302, 303. Furthermore, additional class AB stages such as class AB transistor stage 801a, 801b are provided having an output terminal p1 which is connected to one terminal of the additional resistor 802. Another terminal of resistor 802 is connected to terminal n1 of a complementary operated class AB stage 810a, 810b disposed in the right-hand portion of the circuit. Each one of the two terminals of resistors 802, 803 is controlled by a class AB stage. An array of replica transistors Mprep, Mnrep is provided on either left-hand and right-hand portion of the circuit supplying correction currents to the terminals of the resistors 802, 803.

The class AB stage receives an input signal from node 806 which is the shared drain of the transistors Mp2sp, Mn2sp. Node 806 is connected to the source of a buffer transistor Mc of which the drain is connected to the class AB stages such as 801a, 801b. The class AB amplifier furthermore comprises biasing transistors Mfp, Mfn of complementary type supplied by corresponding bias signals Vp, Vn and connected between the control terminals of the transistors of the class AB stages such as the gate terminals of transistors 801a, 801b. The bias potential Vp, Vn are generated at diode stages 820, 821. Comparing the class AB loop amplifier of the circuit of FIG. 8 with the differential loop amplifier of the circuit of FIG. 5, the class AB arrangement can sustain a larger input voltage value at the expense of a larger power consumption.

The output transistors Mpout, Mnout have twice the size of the class AB stage transistors such as 801, 801b of the replica array. The circuit of FIG. 8 includes an implementation of a class AB output stage drive array for the loop amplifier and additional resistors at each input differential pair source. Matched replicas of class AB output stage inject a signal replica onto each terminal of the resistors 802, 803. A class AB stage keeps current consumption low and provides a large signal range at the LNA input. Concerning the values for the resistors, it is sufficient that all the products of R*is, with is being the signal current injected at the terminals of the resistors by the output stage replicas, are equal in all the input pair associated resistors. This makes a degree of freedom on the value of R and pursues a trade-off between noise and power consumption versus the input signal.

Figure 9:
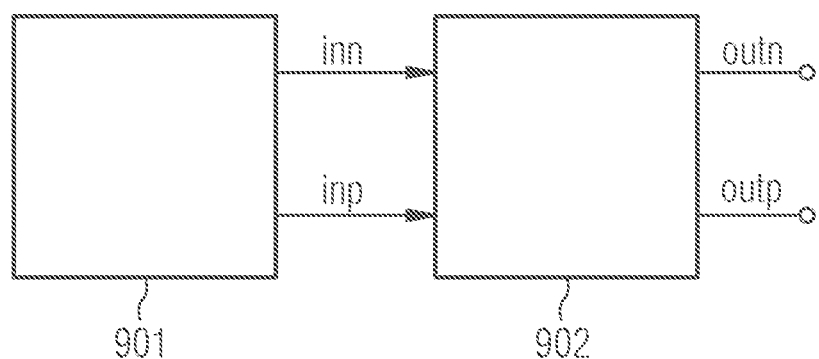
FIG. 9 shows a block diagram of a sensor circuit including a low noise amplifier according to the principles of the present disclosure.

Turning now to FIG. 9 a sensor arrangement is shown including a sensor 901 that generates a differential output signal inn, inp of low amplitude in a noisy circuit environment. The differential output signal of sensor 901 is forwarded to differential low noise amplifier 902 which generates a differential output signal outn, outp with high linearity and reduced noise level. Practically, the noise improvement is about 6 dB.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirit and substance of the disclosure may occur to the persons skilled in the art, the disclosure should be construed to include everything within the scope of the appended claims.

The invention claimed is:

1. An amplifier circuit, comprising:
   a circuit path including a first transistor and a second transistor, the first and second transistors coupled in series and being of complementary type;
   an input terminal operable to receive an input signal, the input terminal connected to control terminals of the first and second transistors;
   a loop amplifier having an input terminal connected to a node disposed between the first and second transistors and having a first and a second complementary output terminal;
   a first feedback loop including the first transistor, the loop amplifier and a first resistor connected to the first output terminal of the loop amplifier;
   a second feedback loop including the second transistor, the loop amplifier and a second resistor connected to the second output terminal of the loop amplifier;
   a third resistor connected to the first resistor and a fourth resistor connected to the second resistor;
   wherein the first and third resistors and the second and fourth resistors each form a voltage divider; and
   wherein the voltage divider of the first and third resistors and the voltage divider of the second and fourth resistors are ohmic voltage dividers.

2. The amplifier circuit according to claim 1, further comprising:
   a first differential pair of transistors, of which one of the transistors is included in the circuit path and connected in series with the first transistor,
   a second differential pair of transistors, of which one of the transistors is included in the circuit path and connected in series with the second transistor, wherein the control terminals of the first and second transistors and the one of the transistors of the first and second differential pair of transistors are connected to the input terminal and the control terminals of the other transistors of the first and second differential pairs of transistors are connected to another input terminal operable to receive another input signal which is complementary to the input signal.

3. The amplifier circuit according to claim 2, wherein the transistors of the first and second pair of transistors are configured as low threshold voltage transistors having a threshold voltage lower than the threshold voltage of the first and second transistors.

4. The amplifier circuit according to claim 3, further comprising a current conveyer circuit having an input terminal connected to the other transistors of the first and second differential pair of transistors and having a first output terminal connected to the first transistor of the current path or to a node between the first and third resistors and having a second output terminal connected to the second transistor of the current path or to a node between the second and fourth resistors, the current conveyer circuit configured to sense the current at its input terminal and generate replicas of the current at its first and second output terminals.

5. The amplifier circuit according to claim 4, the current conveyer circuit comprising at least one pair of source connected transistors, of which a node coupling the source terminals of the source connected transistors is connected to the input terminal of the current conveyer circuit and of which a drain terminal of one of the source connected transistors is connected to one of the first and second output terminals of the current conveyer circuit.

6. The amplifier circuit according to claim 4, the current conveyer circuit further comprising a feedback loop including a comparator amplifier that is connected to the input terminal of the current conveyer circuit and to a terminal for a common mode voltage, the comparator amplifier controlling a reference potential path that supplies reference potentials to the pair of source connected transistors.

7. The amplifier circuit according to claim 2, further comprising a complementary operating circuit portion connected to the third and fourth resistors.

8. The amplifier circuit according to claim 7, further comprising another current conveyer circuit having an input terminal connected to the differentially operating circuit portion and having a first output terminal connected to the node between the first and third resistors and having a second output terminal connected to the node between the second and fourth resistors, the other current conveyer circuit configured to sense the current at its input terminal and generate replicas of the current at its first and second output terminals.

9. The amplifier circuit according to claim 2, wherein the loop amplifier comprises a differential amplifier having an input terminal controlled by a circuit node coupled between the first and second transistors of the circuit path, and having an output terminal controlling a transistor connected in series with the first resistor and having another output terminal controlling a transistor connected in series with the second resistor.

10. The amplifier circuit according to claim 9, further comprising a buffer transistor having a control terminal connected to a bias potential and having a source terminal connected to the node coupled between the first and second transistors of the circuit path and having a drain terminal connected to the input of the differential amplifier, the drain and source terminals of the buffer transistor connected to current sources.

11. The amplifier circuit according to claim 2, wherein the loop amplifier comprises a class AB stage, the class AB stage including:
    a first transistor connected in series with the first resistor and a second transistor connected in series with the second resistor;
    a buffer transistor having a source terminal connected to a circuit node coupled between the first and second transistors of the circuit path and having a drain terminal connected to the control terminal of one of the first and second transistors of the class AB stage; and
    complementary transistors connected between the control terminals of the first and second transistors, the complementary transistors controlled by reference potentials.

12. The amplifier circuit according to claim 11,
    comprising a fifth resistor connected between the first differential pair of transistors and a transistor connected between the fifth and first resistors and a sixth resistor connected between the second differential pair of transistors and another transistor connected between the sixth and second resistors, wherein an additional class AB stage is connected to each one of the terminals of the fifth and sixth resistors.

13. The amplifier circuit according to claim 12,
    wherein the fifth and sixth resistors have a resistance value of twice the resistance value of the third and fourth resistors and wherein the first and second transistors of the class AB stage have twice the size of the transistors of the additional class AB stages.

14. The amplifier circuit according to claim 1, wherein the first and third resistors are connected to a source terminal of the first transistor and the second and fourth resistors are connected to a source terminal of the second transistor.

15. A sensor arrangement, comprising:
a sensor configured to provide a differential signal dependent on an ambient condition; and
an amplifier circuit comprising:
  a circuit path including a first transistor and a second transistor, the first and second transistors coupled in series and being of complementary type;
  an input terminal operable to receive an input signal, the input terminal connected to control terminals of the first and second transistors;
  a loop amplifier having an input terminal connected to a node disposed between the first and second transistors and having a first and a second complementary output terminal;
  a first feedback loop including the first transistor, the loop amplifier and a first resistor connected to the first output terminal of the loop amplifier;
  a second feedback loop including the second transistor, the loop amplifier and a second resistor connected to the second output terminal of the loop amplifier;
  a third resistor connected to the first resistor and a fourth resistor connected to the second resistor,
wherein the amplifier circuit is configured to receive the differential signal and configured to output an amplified signal of reduced noise.

* * * * *